(12) United States Patent
Allman

(10) Patent No.: US 6,570,221 B1
(45) Date of Patent: *May 27, 2003

(54) BONDING OF SILICON WAFERS

(75) Inventor: Derryl D. J. Allman, Colorado Springs, CO (US)

(73) Assignee: Hyundai Electronics America, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/097,183

(22) Filed: Jul. 27, 1993

(51) Int. Cl.$^7$ .............................................. H01L 27/01
(52) U.S. Cl. ........................ 257/347; 257/725; 257/777
(58) Field of Search ............................. 257/67, 68, 69, 257/723, 724, 725, 726, 727, 777, 347

(56) References Cited

U.S. PATENT DOCUMENTS

| | | | |
|---|---|---|---|
| 4,555,720 A | * 11/1985 | Readhead | 257/440 |
| 4,939,568 A | * 7/1990 | Kato et al. | 257/686 |
| 4,994,409 A | 2/1991 | Yoon et al. | 438/9 |
| 5,003,062 A | * 3/1991 | Yen | 438/761 |
| 5,006,913 A | * 4/1991 | Sugahara et al. | 257/67 |
| 5,100,503 A | * 3/1992 | Allman et al. | 438/694 |
| 5,152,834 A | 10/1992 | Allman | 106/287.13 |
| 5,169,472 A | 12/1992 | Goebel | 156/281 |
| 5,234,860 A | 8/1993 | Gluck | 438/67 |
| 5,236,118 A | 8/1993 | Bower et al. | 228/193 |
| 5,254,497 A | 10/1993 | Liu | 438/384 |
| 5,266,511 A | 11/1993 | Takao | 438/401 |
| 5,343,064 A | * 8/1994 | Spangler et al. | 257/350 |
| 5,383,993 A | 1/1995 | Katada et al. | 156/153 |
| 5,400,489 A | 3/1995 | Hegner et al. | 29/25.41 |
| 5,407,856 A | 4/1995 | Quenzer et al. | 438/455 |
| 5,438,022 A | 8/1995 | Allman et al. | 438/763 |

FOREIGN PATENT DOCUMENTS

| | | | |
|---|---|---|---|
| EP | 0 388 862 | 9/1990 | |
| JP | 144038 | 12/1984 | |
| JP | 63202034 | 8/1988 | |
| JP | 4-84471 | 3/1992 | H01L/43/12 |
| JP | 4180675 | 6/1992 | |
| JP | 5-55455 | 3/1993 | H01L/27/00 |
| JP | 5-55534 | 3/1993 | H01L/27/12 |

OTHER PUBLICATIONS

S. Wold, Silicon Processing for the VLSI Era, vol. 2, Process Integration, pp. 232–33, 1990.*
S. Wolf, Silicon Processing for the VLSI Era, vol. 2, Process Integration; pp. 3 and 230, 1990.*
Yamada et al.; SOI by Wafer Bonding with Spin–on Glass as Adhesive; Electronics Letters; vol. 23, No. 1, Jan., 1987; pp. 39–40.
S. Wolf, Silicon Processing for the VLSI Era, vol. 2, Process Integration; 1990; pp. 3, 229–230, and 232–233.
Y. Morita et al; Doping of Trench Capacitor Cell with As SOG for 4 Megabit DRAM's; Extended Abstracts of the 19th Conference on Solid State Devices and Materials, Tokyo, 1987; pp. 311–314.
Extended Abstracts Fall Meeting; vol. 88–2; Chicago, IL; 1988; pp. 687–688.

* cited by examiner

*Primary Examiner*—George Eckert
(74) *Attorney, Agent, or Firm*—Townsend and Townsend and Crew LLP

(57) ABSTRACT

The invention concerns the use of spin-on-glass (SOG) to bond two layers of semiconductor together, in order to form a Silicon-on-Insulator (SOI) structure. One type of SOG is a cross-linked siloxane polymer, preferably of the poly-organo-siloxane type, comprising a carbon content of at least 5 atomic weight percent.

17 Claims, 6 Drawing Sheets

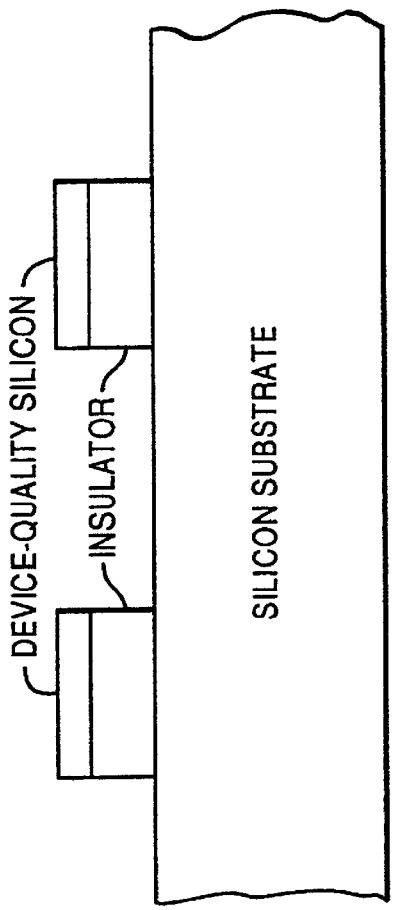
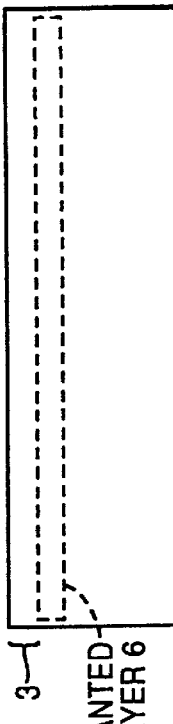
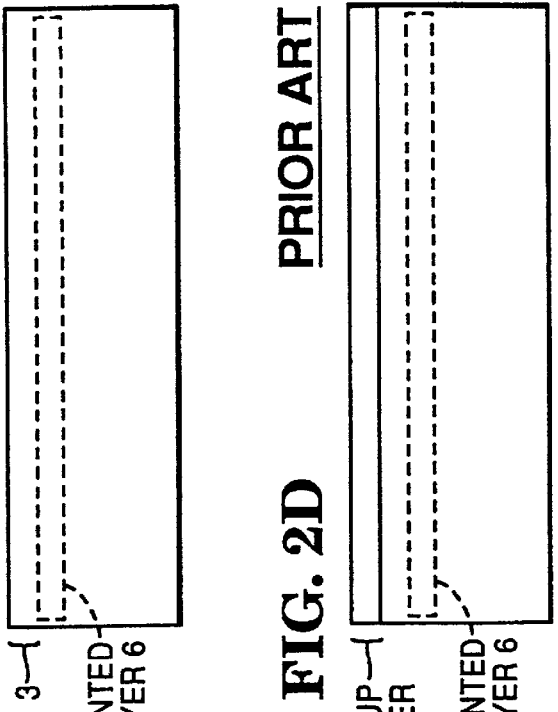
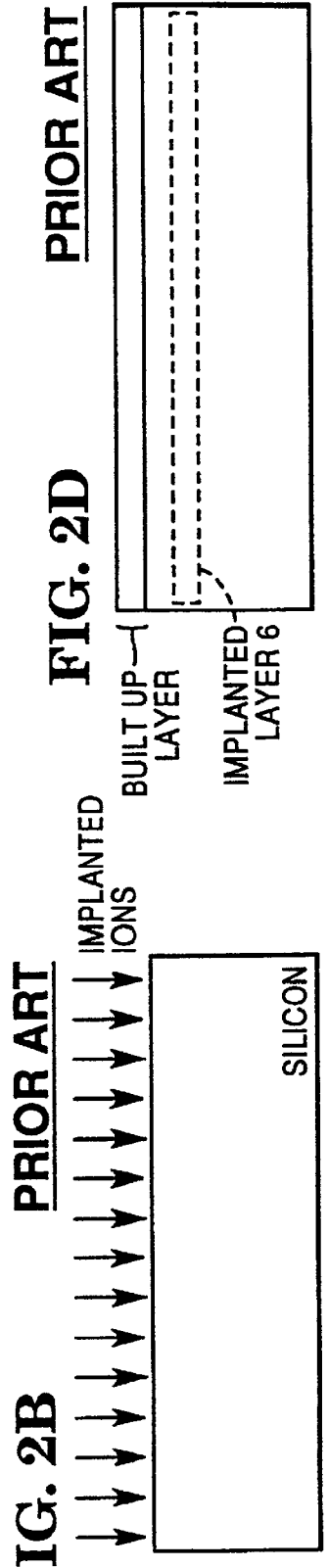

BONDING OF SILICON WAFERS

The invention concerns fabrication of a structure called SOI, Silicon On Insulator. The SOI structure can be viewed as three-layered: the Silicon layer (the "S" in SOI) is attached to the Insulator (the "I" in SOI), using a layer of spin-on glass (SOG) as an adhesive.

BACKGROUND OF THE INVENTION

Very Large Scale Integration (VLSI), Ultra Large Scale Integration (ULSI), and higher-density approaches to integrated circuit fabrication require reduced parasitic capacitances. One approach to reducing these capacitances is the use of silicon-on-insulator (SOI) techniques.

In SOI fabrication, layers of device-quality silicon are formed upon insulating islands, as shown in FIG. 1. In one method of SOI fabrication, silicon is grown upon sapphire (the INSULATOR in FIG. 1) in an epitaxial growth step.

In another method, shown in FIGS. 2A–2D, oxygen (or nitrogen) is implanted through silicon, to form a buried layer of silicon dioxide (or silicon nitride). After implantation, an epitaxial layer 3 may be added to the silicon located above the implant, in order to provide a thicker silicon layer. The silicon layer 3 provides the device-quality silicon.

SOI technology is not without drawbacks. Epitaxial approaches have several disadvantages.
1. Epitaxial growth is expensive.
2. The epitaxially grown silicon is not always sufficiently defect-free.
3. Adhesion problems can result between the epitaxial layer and the substrate.
4. Stresses can occur at the silicon-insulator interface, because of (a) different thermal coefficients of expansion, and (b) mismatch between the inter-atomic spacing of the silicon, compared with that of the insulator.

Implantation Approaches also Face Disadvantages.
1. The implantation approach requires implantation equipment, which is expensive.
2. During implantation, the implanted species disrupts the crystalline structure of the silicon. An annealing step is required to restore proper crystallinity of the silicon.
3. Practical implantation energies cannot supply the required implant depth for most implant species. Further, a layer 3 in FIG. 2C is frequently obtained, in which no substantial implantation occurred. Sometimes, this layer 3 may be too thin, requiring that the thickness of layer 3 be increased. The increase in thickness is generally accomplished by epitaxial techniques, which require added processing steps, shown in FIG. 2D.
4. There is a limit to the amount of implanted species which can be implanted. Thus, the doping concentration, and thus the conductivity, of the implanted layer 6 in FIG. 2D is limited.

OBJECTS OF THE INVENTION

It is an object of the invention to provide an improved silicon-on-insulator structure.

It is a further object of the invention to provide a method of fabricating two single-crystal layers of silicon which are bonded together.

It is a further object of the invention to provide a method of fabricating two single-crystal layers of silicon which are bonded together, and can withstand the high temperatures used in subsequent fabrication steps.

SUMMARY OF THE INVENTION

In one form of the invention, two silicon wafers are bonded together using spin-on-glass (SOG). Then, one of the layers is polished to reduce its thickness. Integrated circuits are fabricated on the thinner, polished, layer.

BRIEF DESCRIPTION OF THE DRAWINGS

FIG. 1 illustrates silicon-on-insulator structures.

FIGS. 2A–2D illustrate a sequence of steps which form silicon-on-insulator using implantation.

DETAILED DESCRIPTION OF THE INVENTION

Figure 3A:
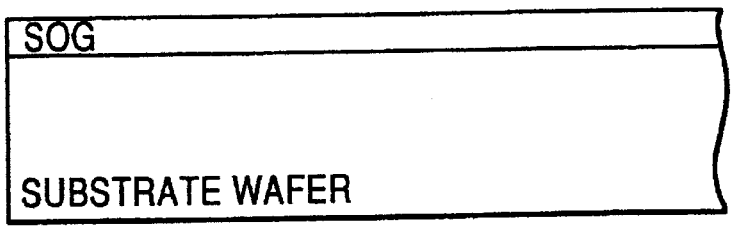
FIGS. 3A–3C illustrate a sequence of steps used in the invention.
Figure 4:
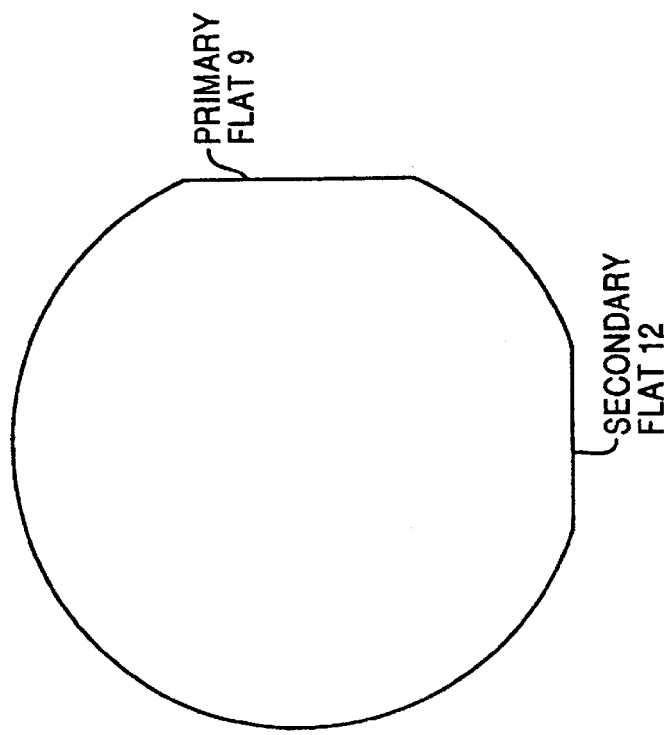
FIG. 4 illustrates a silicon wafer.

FIG. 4 illustrates a standard silicon wafer. A wafer of this type is used as a SUBSTRATE WAFER in FIG. 3A. Under the invention, spin-on-glass (SOG) is applied to the SUBSTRATE WAFER, as indicated. SOG is known in the art. Descriptions of SOG processes are given in the following U.S. Pat. Nos.:

5,100,503 Inventors: Allman & Lee Issued: Mar. 31, 1992
5,152,834 Inventor: Allman Issued: Oct. 6, 1992
These patents are incorporated by reference.

The SOG is applied to a thickness ranging from 1,000 to 30,000 Angstroms. (To achieve thicknesses in the higher levels of this range, repeated SOG coatings may be necessary, using a baking step at a temperature exceeding 80 degrees C. between coatings to remove solvents and to initiate cross-linking.)

Figure 3B:
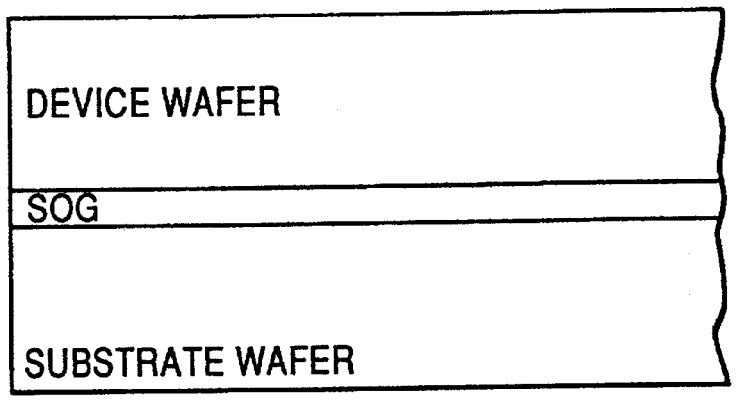

Next, another silicon wafer (a DEVICE WAFER) is placed in contact with the SOG, as shown in FIG. 3B. The SOG is then cured at a temperature between 300 C. and 1400 C. in either (a) vacuum, (b) room air, (c) nitrogen, (d) forming gas, (e) argon, (f) HMDS, (g) oxygen, or (h) a mixture of these gases, as appropriate. The cured SOG forms a siloxane polymer, which bonds the two wafers together. The cured SOG is very stable at the high temperatures (e.g., 800–1100 degrees C.) which will be experienced in later processing steps.

Figure 3C:
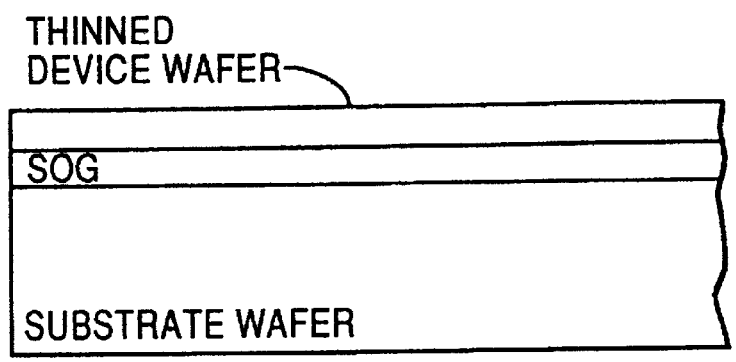

Next, one of the wafers is polished to reduce its thickness. A typical 4-inch wafer has an initial thickness of 675 micrometers (i.e., microns). This thickness is reduced to about 0.7 to 10 microns, as appropriate, as shown in FIG. 3C.

Following the polishing step, transistors and integrated circuits are fabricated on the thinned, polished, DEVICE WAFER, as known in the art. The device layer can be etched, to form isolated islands, of the type shown in FIG. 1. The thickness of the polished DEVICE WAFER controls the latch-up characteristics and the transistor characteristics.

Additional Considerations

1. The cured SOG has the following approximate electrical characteristics:

Relative dielectric constant: less than 4.0.
Dielectric strength: exceeding 4 million volts/meter.

2. It may be possible to use thinner, less expensive, wafers as the DEVICE WAFERs in FIG. 3B. That is, commercially available 4-inch silicon wafers are generally about 675 microns thick. However, the devices fabricated (FETs, BJTs, etc.) occupy only a very thin layer of this 675 micron thickness. Specifically, the devices typically do not penetrate more than 5 or 10 microns below the surface of the wafer (an n-well in a CMOS device typically penetrates about 20 microns). The polishing operation of the invention removes most of the 675 micron thickness. This removed silicon was expensive to produce: it is highly refined, extremely pure, and, in the wafer, is of the single-crystal type.

The primary reason for using a thick wafer is to obtain mechanical support. A thin wafer which is just thick enough to accommodate the transistors, and thus about 5 to 10 microns thick, would be too flimsy for handling in a manufacturing environment.

As an alternative to removing the silicon, it may be desirable to start with thinner, more fragile wafers, since they will be handled only a few times, such as during attachment to the SUBSTRATE WAFER. Wafers as thin as 50 microns may be considered. These thin wafers may be less expensive, once mass production facilities are implemented to produce them. Further, the thinner wafers will reduce the time needed to polish them down to the final thickness of 1 to 10 microns. The polishing step will be less costly.

Figure 5:
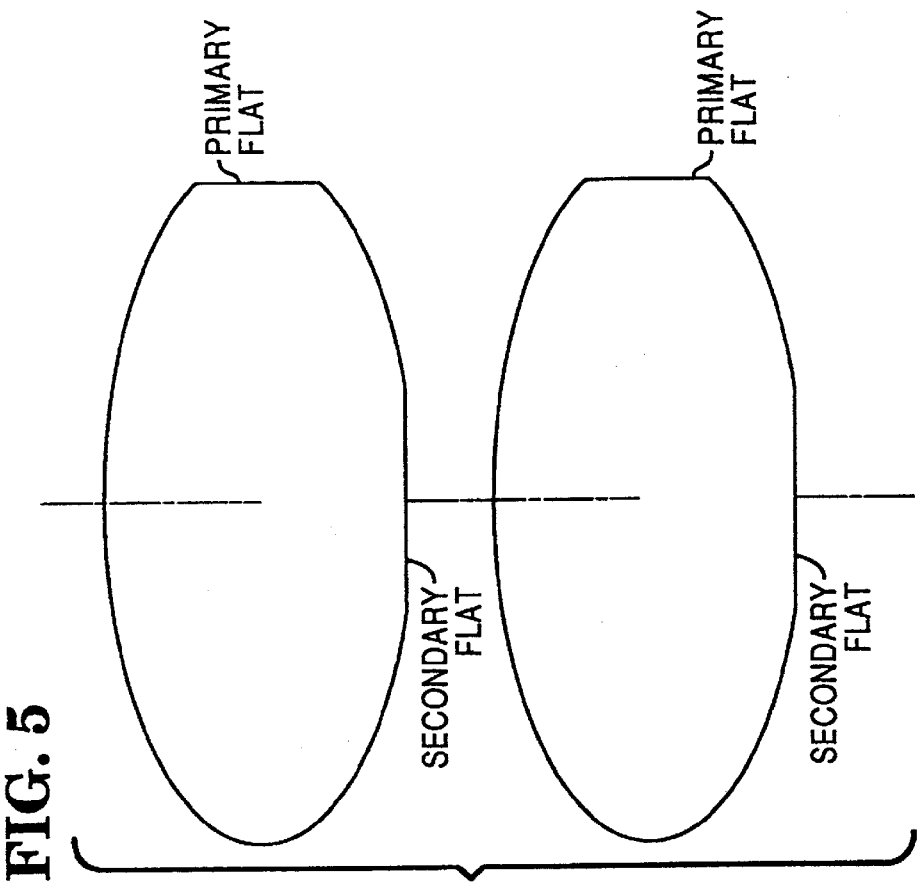
FIG. 5 illustrates one approach to stacking two wafers.

3. Commercially available wafers arrive from the manufacturer with one or two identifying flats 9 and 12 in FIG. 4. The relative positions of the primary flat and the secondary flat (if present) designates doping type (n or p), and the crystal orientation of the silicon (100 or 111). Under the invention, to simplify handling of stacked wafers by automated equipment, it may be desirable to align the flats of the DEVICE WAFER with those of the SUBSTRATE WAFER, as shown in FIG. 5.

In addition, there is no general requirement that the two wafers have identical doping types, or identical crystal orientations. Thus, the wafers may have different identifying flats. Considering two wafers, there are four combinations of doping types, namely, DEVICE WAFER: n SUBSTRATE WAFER: n,
DEVICE WAFER: n SUBSTRATE WAFER: p,
DEVICE WAFER: p SUBSTRATE WAFER: n, and
DEVICE WAFER: p SUBSTRATE WAFER: p.

Typical n-type wafers have 100 or 111 crystal orientation; the same is true for each p-type. Therefore, numerous combinations of flat types are possible. Consequently, it may be preferable to align the primary flats only; the secondary flats will assume the relative orientations dictated by the primary flats.

4. In general, the wafer manufacturer provides wafers having one side which is highly polished, and scratch-free. The devices are fabricated on this polished side. However, the present invention prefers that the surfaces which are bonded together be of the highly polished type. Thus, if standard wafers are used, no exterior polished side remains for device fabrication, because the polished sides now sandwich the SOG between themselves. A polished surface must be generated, by a grind-and-polish operation.

If, instead, one wafer has two polished sides, then an exterior polished side will exist after SOG bonding. If this wafer is to be made thinner, by polishing, the initial polished surface will be destroyed, and replaced by a new polished surface, which results from the polishing step.

In either case, as indicated above, a polished surface of the top wafer is required, in order to provide a defect-free surface to insure good device characteristics, such as diode leakage and gate oxide integrity.

5. The invention can facilitate multi-layer ICs. Today, the vast majority of integrated circuits manufactured are of the planar type, instead of the multi-layer type. Planar ICs contain transistors arranged in a single layer. However, there may be a limit to the number of transistors which can be packed into a single layer. In order to circumvent this limit, and attain higher numbers of transistors per IC, it may be desirable to manufacture multi-layered ICs, using SOG to attach adjacent layers.

Figure 7:
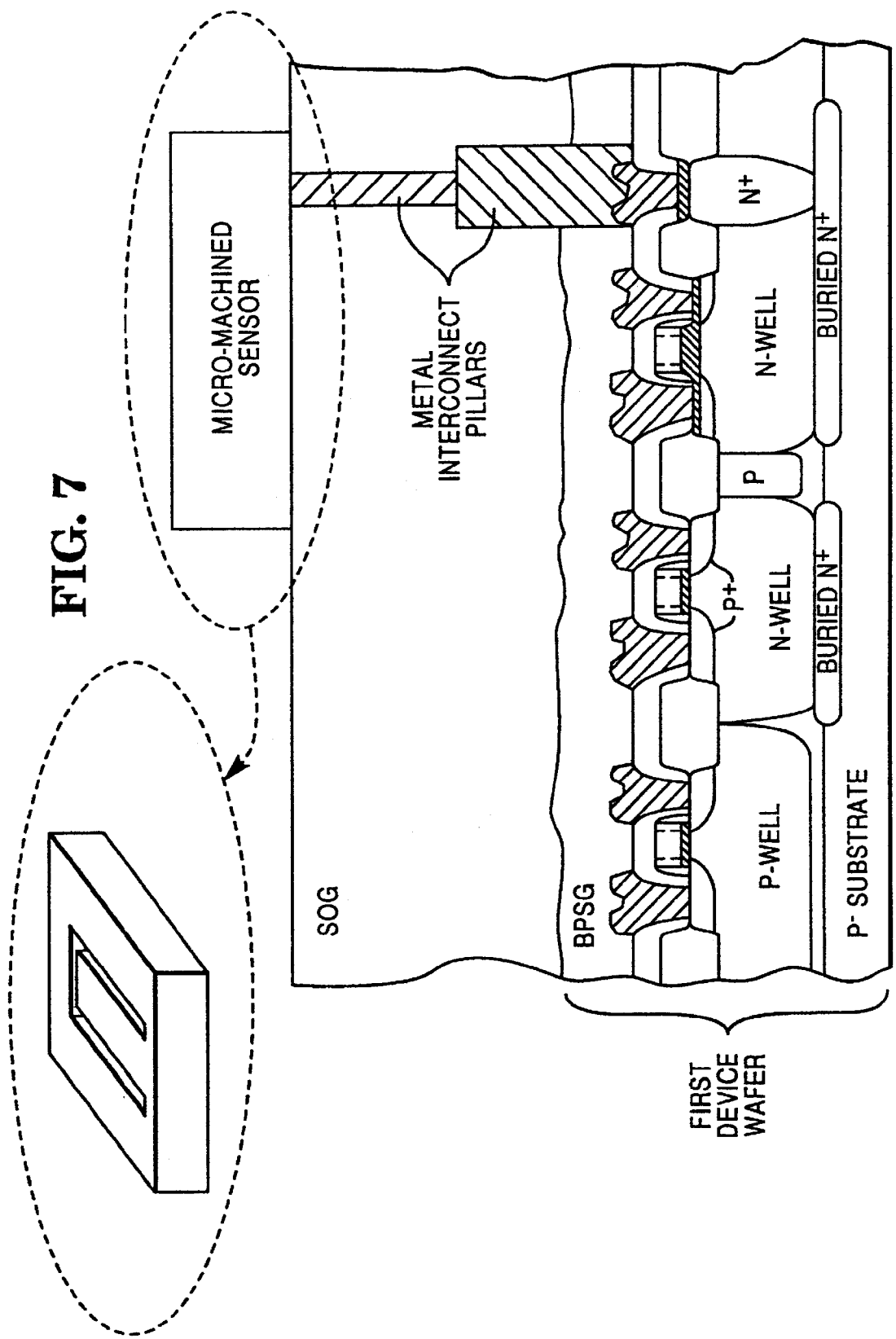
FIG. 7 illustrates a micro-machined sensor bonded to a silicon substrate using SOG.

In one type of multi-layer IC, micro-machined sensors can be bonded to the IC circuits by using SOG, as shown in FIG. 7. The SOG can act as a passivation layer for the IC circuit or the micro-machined circuitry to which connections are made.

Exemplary micro-machined sensors are diaphragm pressure sensors, cantilevered acceleration sensors, and cantilevered flow sensors. Such sensors are known in the art. FIG. 7 schematically illustrates a micro-machined acceleration sensor of the "diving board" type.

Figure 6:
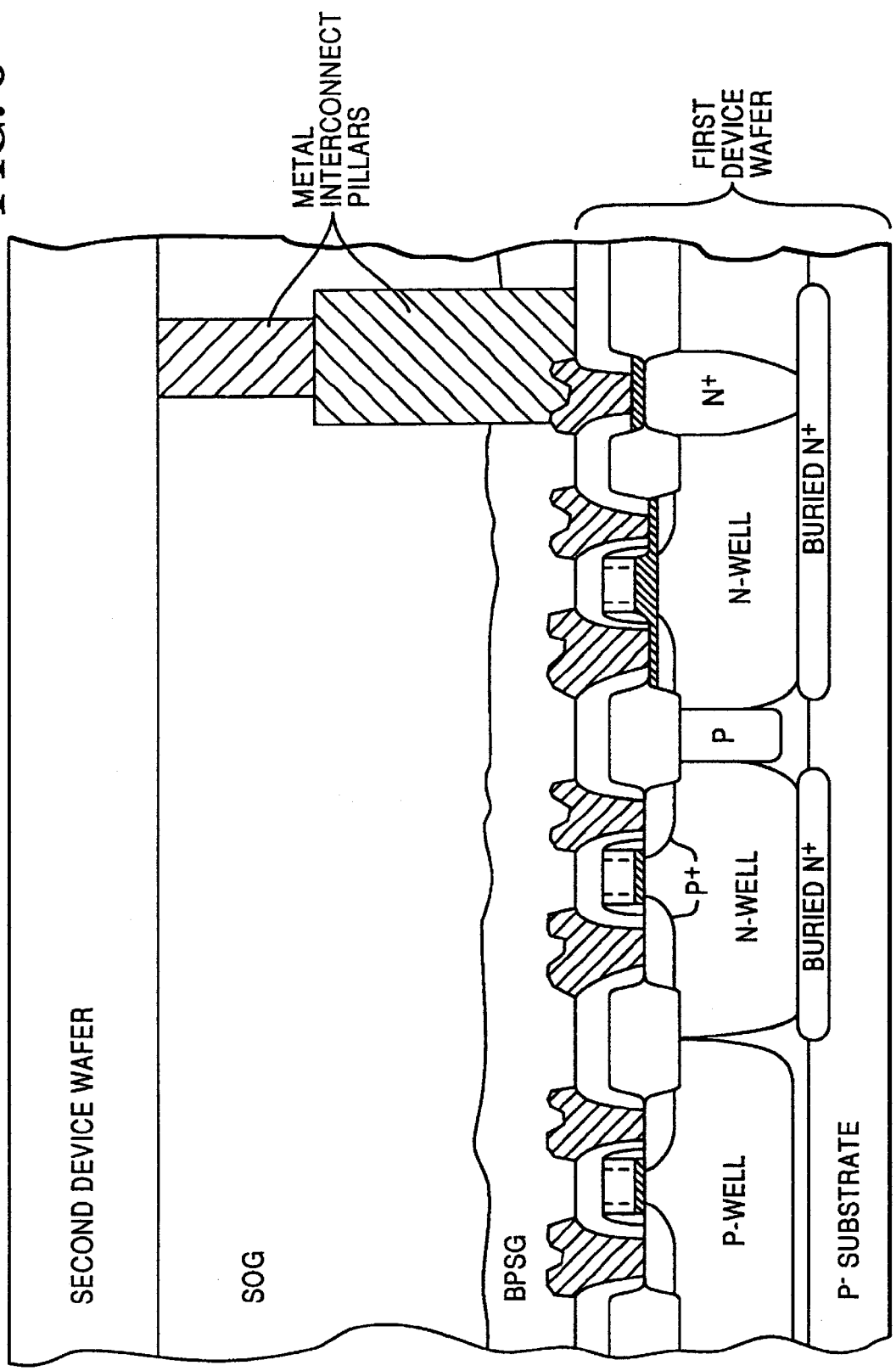
FIG. 6 illustrates how the invention can be used to form multi-level integrated circuits.

Under one form of the invention, an IC is fabricated, as known in the art. A representative cross-section is shown in FIG. 6. Then, SOG is applied, as described above, and a second DEVICE WAFER is applied, as shown, and polished, to reduce its thickness. The SOG is cured, and additional ICs are manufactured on the second DEVICE WAFER. Vias are fabricated, as known in the art, connecting selected points on the first DEVICE WAFER with those on the second. Additional layers can be added in the same way.

The fabrication procedure for the second layer of ICs will involve heating steps which will probably alter the doping profiles of the first layer: the higher temperature will cause the dopants to diffuse and rearrange themselves. To avoid this alteration, it may be desirable to fabricate the first and second DEVICE WAFERs separately. These layers are then attached using the SOG procedure. Connecting vias are fabricated, as known in the art.

Figure 8A:
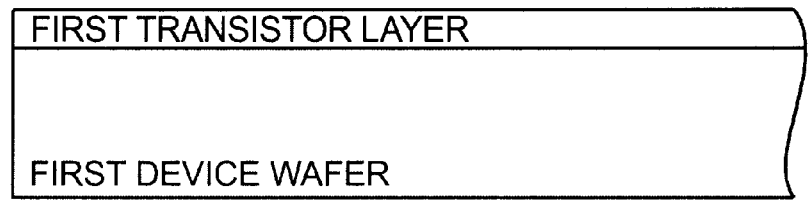
FIGS. 8A–8C illustrate first and second device wafers joined with a SOG layer such that transistors from one wafer face transistors from the other wafer.
Figure 8B:
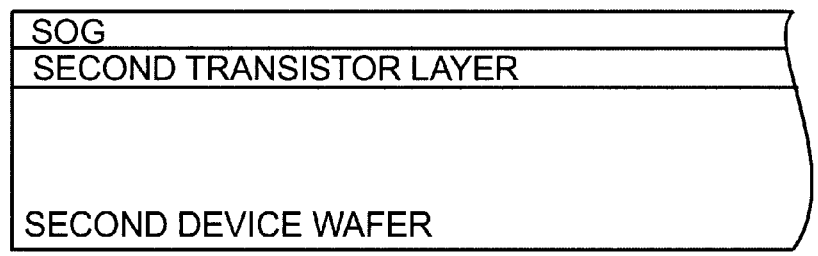
Figure 8C:
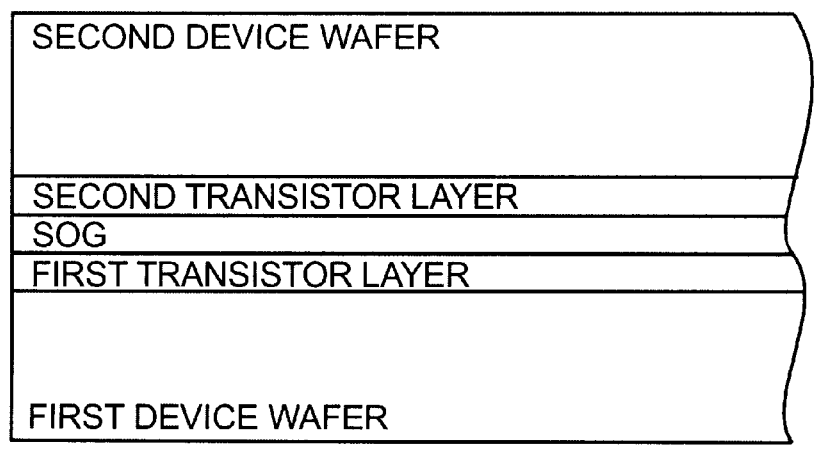

Some embodiments could form a multi-layered IC where two wafers are joined using SOG such that transistors from one wafer face transistors from another wafer. In one embodiment, a highly cross-linked siloxane polymer bonds the two wafers together using the SOG technique discussed above. With reference to FIG. 8A, a first device wafer includes a first transistor layer with various circuits deposited thereon in a conventional manner. In FIG. 8B, a second device wafer is shown that includes a second transistor layer with various circuit deposited thereon in the conventional manner. A SOG layer is applied to the second device wafer in a manner similar to that discussed in relation to FIG. 3B above. After the first and second device wafers are joined, a multi-layer device is produced as shown in FIG. 8C. Those skilled in the art can appreciate that the method described above in relation to FIGS. 3A and 3B can be used to join the first and second device wafers.

6. Some fabrication steps may require etching of the cured SOG. Two possible etchants are hydrofluoric acid and nitric acid.

7. Some claims of this patent refer to layer of silicon, or to silicon wafers. This type of silicon is elemental silicon, not a silicon compound. Further, the silicon wafers under consideration are of electronic grades of purity (or "device quality"), and of the single-crystal type. An example will illustrate the relevance of these characteristics.

Boro-phosphosilicate glass, BPSG, is frequently used as a passivation coating for integrated circuits. However, even though this glass contains silicon, and may be in the form of a layer, it does not qualify as a "silicon layer." The silicon in the glass is not elemental: it is bonded to oxygen in a network to form an amorphous silicon dioxide layer.

8. In this Specification, silicon layers have been considered. However, other semiconductor layers, such as germanium and gallium arsenide, can be bonded using SOG. Further, as stated above, the SOG can be used to bond an individual element, such as a micro-machined sensor, to a semiconductor substrate containing circuitry which interacts with the sensor. FIG. 7 is a schematic of such bonding.

9. The SOG is preferably a layer of cross-linked siloxane polymer sandwiched between the wafers. Preferably, the SOG is of the poly-organo-siloxane type, comprising a carbon content of at least 5 atomic weight percent.

10. Currently, SOI wafers are formed using the SIMOX process. The SIMOX process implants oxygen or nitrogen at a dose of $1.2$–$2.2 \times 10^{18}/cm^2$ at an implant energy in excess of 150 KeV into a silicon wafer heated to a temperature in excess of 400 C.

The SIMOX wafers are then annealed in a furnace at a temperature greater than 1150 C. to epitaxially regrow the implanted damaged region in the silicon wafer and to out-diffuse the excess oxygen near the silicon's surface.

Numerous substitutions and modifications can be undertaken without departing from the true spirit and scope of the invention. What is desired to be secured by Letters Patent is the Invention as defined in the following claims.

What is claimed is:

1. A multi-layer semiconductor, comprising:
   a first semiconductor wafer comprising a micro-machined sensor;
   a second semiconductor wafer comprising a surface;
   a second semiconductor device on the surface; and
   a layer of cross-linked siloxane polymer sandwiched between the first semiconductor wafer and the surface, wherein:
   the layer of cross-linked siloxane polymer bonds the first and second semiconductor wafers together; and
   the layer of cross-linked siloxane polymer is formed through spin-on-glass.

2. The multi-layer semiconductor according to claim 1, wherein one of the first and second semiconductor wafers is between 0.1 micron and 675 microns thick.

3. The multi-layer semiconductor according to claim 1, wherein at least one of the first and second semiconductor wafers comprises single-crystal silicon.

4. The multi-layer semiconductor according to claim 1, wherein the layer of cross-linked siloxane polymer comprises a plurality of siloxane polymer layers which are successively formed.

5. The multi-layer semiconductor according to claim 4, wherein the apparatus is cured at a temperature of about 80 degrees C. between applying each of the plurality of siloxane polymer layers.

6. The multi-layer semiconductor according to claim 1, wherein one of the first and second semiconductor wafers is less than 10 microns thick.

7. The multi-layer semiconductor according to claim 1, wherein at least one of the first and second semiconductor wafers comprises integrated circuits.

8. The multi-layer semiconductor according to claim 1, wherein the cross-linked siloxane polymer is of the poly-organo-siloxane type, comprising a carbon content of at least 5 atomic weight percent.

9. The multi-layer semiconductor according to claim 1, wherein the micro-machined sensor is at least one of a diaphragm pressure sensor, a cantilevered acceleration sensor and a cantilevered flow sensor.

10. A multi-layer integrated semiconductor, comprising:
    a first silicon substrate, wherein the first silicon substrate comprises a micro-machined sensor;
    a second silicon substrate;
    a layer on the second silicon substrate, wherein the layer comprises a transistor; and
    a third layer comprising a highly cross-linked siloxane polymer, which bonds the first silicon substrate and the layer together, wherein the third layer of highly cross-linked siloxane polymer is formed through spin-on-glass.

11. The multi-layer integrated circuit according to claim 10, wherein the highly cross-linked siloxane polymer is of the poly-organo-siloxane type, comprising a carbon content of at least 5 atomic weight percent.

12. The multi-layer integrated circuit according to claim 10, wherein the third layer of highly cross-linked siloxane polymer comprises a plurality of siloxane polymer layers which are successively formed.

13. The multi-layer integrated circuit according to claim 12, wherein the integrated circuit is cured at a temperature of about 80 degrees C. between applying each of the plurality of siloxane polymer layers.

14. The multi-layer integrated circuit according to claim 10, further comprising three or more wafers with highly cross-linked siloxane polymer between each of the three or more wafers.

15. The multi-layer integrated circuit according to claim 10, further comprising vias which couple the micro-machined sensor to the transistor, wherein the vias penetrate the layer of highly cross-linked siloxane polymer.

16. The multi-layer electronic device according to claim 10, wherein the micro-machined sensor is at least one of a diaphragm pressure sensor, a cantilevered acceleration sensor and a cantilevered flow sensor.

17. A multi-layer semiconductor, comprising:
    a first semiconductor wafer comprising a micro-machined device;
    a second semiconductor wafer comprising a surface;
    a second semiconductor device on the surface; and
    a layer of cross-linked siloxane polymer bonding the first semiconductor wafer and the surface together, wherein the layer of cross-linked siloxane polymer is formed as spin-on-glass.

* * * * *